United States Patent [19]

Toda et al.

[11] 4,045,231

[45] Aug. 30, 1977

[54] PHOTOSENSITIVE RESIN COMPOSITION FOR FLEXOGRAPHIC PRINTING PLATES

[75] Inventors: Hiroyuki Toda, Samukawa; Eiichi Otomegawa, Kawasaki; Toshimi Aoyama, Yokohama; Hisashi Nakane, Kawasaki, all of Japan

[73] Assignee: Tokyo Ohka Kogyo Kabushiki Kaisha, Kawasaki, Japan

[21] Appl. No.: 658,855

[22] Filed: Feb. 18, 1976

[30] Foreign Application Priority Data

Oct. 17, 1975 Japan .............................. 50-125092
Mar. 15, 1975 Japan .............................. 50-31414

[51] Int. Cl.$^2$ ............................................. G03C 1/68
[52] U.S. Cl. ................................. 96/115 P; 96/35.1; 204/159.17
[58] Field of Search ............... 96/115 P, 115 R, 35.1; 260/880 B; 101/457; 204/159.17, 159.15

[56] References Cited

U.S. PATENT DOCUMENTS 3,676,386 7/1972 Brenner et al. ................. 260/880 B
3,925,076 12/1975 Heimsch et al. ..................... 96/35.1

OTHER PUBLICATIONS

Chemical Abstracts, vol. 72, Col. 133801v.

*Primary Examiner*—John D. Welsh
*Attorney, Agent, or Firm*—Brisebois & Kruger

[57] ABSTRACT

A photosensitive resin composition for flexographic printing plates comprising styrene-butadiene block copolymer containing 35 – 50% by weight of styrene, at least one liquid prepolymer having a molecular weight of 1,000 – 5,000 selected from the group consisting of polybutadiene and butadiene-styrene copolymer, at least one photopolymerizable monomer containing at least one vinyl group, such as tetraethyleneglycol diacrylate, a photopolymerization initiator such as benzophenone, and a thermopolymerization inhibitor optionally added. This photosensitive resin composition affords relief images suitable for use in flexographic printing.

10 Claims, 4 Drawing Figures

PHOTOSENSITIVE RESIN COMPOSITION FOR FLEXOGRAPHIC PRINTING PLATES

BACKGROUND OF THE INVENTION

The present invention relates to a photosensitive resin composition useful for the manufacture of relief plates for flexographic printing.

Hitherto, a rubber plate is chiefly used as a printing plate for flexographic printing. However, the prior art process for the manufacture of rubber plates for use in flexographic printing is extremely disadvantageous in the aspects of cost and working time since such process requires many working steps including those of exposure to light, development and etching for manufacturing a metallic original plate, manufacturing a mother plate from heat-resistant plastics, and manufacturing a rubber plate for use in flexographic printing by heating and pressing a rubbery material with the mother plate. In addition, the rubber plate obtained according to the prior art process is poor in accuracy and so requires such after-treatment as polishing on actual use. In the manufacture of rubber plates, a limitation naturally exists in the size of reproducible plates on account of the complexity of the apparatus and the steps so that rubber plates of a large size cannot be obtained.

On the other hand, there is proposed a process for the manufacture of relief printing plates wherein a photosensitive resin composition is utilized. For example, there is known a process for obtaining a relief plate which comprises shaping a mixture of a linear polymer, a monomer having at least one photopolymerizable olefinic double bond and a photopolymerization initiator into a sheet, exposing the sheet through an original to light, and washing off unexposed areas with a solvent. The use of a photosensitive resin composition comprised predominantly of an elastomeric polymer such as chloroprene rubber, nitrile rubber, polyurethane rubber, styrene-butadine block copolymer or styrene-isoprene block copolymer; a photopolymerizable monomer and a photopolymerization inhibitor is also known (Japanese Patent provisional Publn. No. 37521/72) for improving the properties of relief plates.

A relief plate obtained according to such known conventional processes brings about a significantly good result as compared with a rubber plate. In the case of flexographic printing on materials with coarse surfaces or materials having uneven thickness, however, such relief plate is poor in contact with the materials to be printed and still fails to obtain satisfactory results.

As a result of various researches made to overcome the drawbacks of the prior art photosensitive resin compositions for flexographic printing plates, it has now been found that such drawbacks can be overcome by the use of a specific styrene-butadiene block copolymer and a specific prepolymer. The present invention has been accomplished on the basis of the above finding.

BRIEF SUMMARY OF THE INVENTION

In accordance with the present invention, there is provided a photosensitive resin composition for flexographic printing plates comprised of (a) styrene-butadiene block copolymer containing 35 - 50% by weight of styrene, (b) at least one liquid prepolymer having a molecular weight of 1,000 - 5,000 selected from the group consisting of polybutadiene and butadiene-styrene copolymer, (c) at least one photopolymerizable monomer containing one or more vinyl groups, and (d) a photopolymerization initiator.

It is an object of the present invention to provide a photosensitive resin composition for flexographic printing plates which is easily capable of forming deep relief images according to usual exposing and developing treatments.

It is another object of the present invention to provide a photosensitive resin composition for flexographic printing plates which affords a relief image suitable for printing on materials with coarse surfaces or materials having uneven thickness.

It is still another object of the present invention to provide a photosensitive resin composition for flexographic printing plates which is excellent in printing aptitude such as the rate of ink transfer, revolving power or the like and in printing effect.

It is a further object of the present invention to provide a photosensitive resin composition for flexographic printing plates which are excellent in transparency.

BRIEF DESCRIPTION OF THE DRAWING

Other and further objects, features and advantages of the present invention will be apparent from the following description taken in connection with the accompanying drawings wherein.

DETAILED DESCRIPTION OF THE INVENTION

Figure 1:
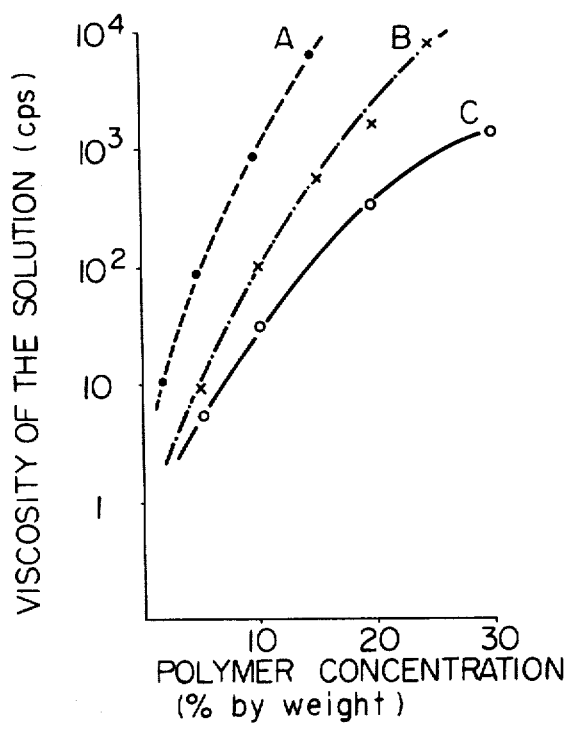
FIG. 1 is a graph showing the relation between the polymer concentration and the viscosity of solution in copolymers having various styrene contents.
Figure 2:
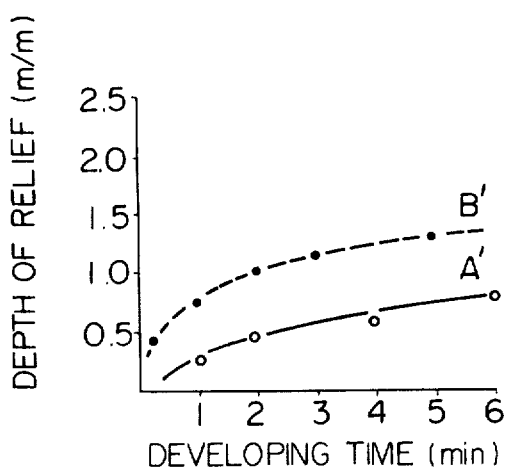
FIG. 2 is a graph showing the relation between the developing time and the depth of relief in copolymers having various styrene contents.

The block copolymer utilizable as the component (a) in the composition of the present invention is a soluble, thermoplastic, elastomeric block copolymer composed of at least two thermoplastic non-elastomeric moieties, i.e. polystyrene blocks and an elastomeric moiety, i.e. polybutadiene block interposed between the polystyrene blocks. For example, the block copolymer can be shown by the general formula:

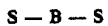

wherein S stands for a non-elastomeric block having an average molecular weight of 2,000 - 100,000 and a glass transition temperature of at least 25° C and B for an elastomeric block having an average molecular weight of 25,000 - 1,000,000 and a glass transition temperature of at most 0° C. This soluble, thermoplastic, elastomeric block copolymer should contain 35 - 50% by weight of a non-elastomeric block, i.e. polystyrene block. Such styrene content brings about such merits that the viscosity of the solution becomes extremely low, that solubility in a developer solution becomes very quick and that fatigue of the developer solution becomes extremely low. For example, FIG. 1 which is a graph showing the relation between the polymer concentration (% by weight) and the viscosity (cps) in toluene solutions at 20° C of (A) neoprene, (B) styrene-butadiene block copolymer containing 31% by weight of styrene and (C) styrene-butadiene block copolymer containing 42% by weight of styrene, teaches that the block copolymer utilizable as the component (a) is much lower in viscosity of the solution than any of the other polymers. FIG. 2 which is a graph showing the relation between the developing time and the depth of relief in a developing treatment for (A') styrene-butadiene block copolymer containing 31% by weight of styrene and (B') styrenebutadiene block copolymer containing 42% by weight of styrene conducted at 25° C with a mixture of 1,1,1-trichloroethane and isopropyl alcohol (mixing ratio: 3:1 by volume) as a developer solution, also teaches that the block copolymer utilizable as the component (a) is much more quickly dissolved in the developer solution than the other.

In the present invention, the block copolymer containing less than 35% by weight of styrene is more or less opaque and incurs scattering of light within itself so that the deeper portion is difficult to be hardened. Moreover, such block copolymer is poor in solubility and is swollen with a solvent, thus making it impossible to form a delicate image. In case the styrene content is 35% by weight or more, both transparency and solubility become good. If the styrene content exceeds 50% by weight of the block copolymer, however, the resultant printing plate will lose rubberlike elastomeric properties and show undesirable plastics-like properties.

The liquid prepolymer utilizable as the component (b) in the composition of the present invention is polybutadiene or butadiene-styrene copolymer each having a molecular weight of 1,000 – 5,000. Such polybutadiene and butadiene-styrene copolymer may be used singly or as a mixture of at least two. More precisely, the liquid prepolymer is polybutadiene which contains in the molecular 1,2-bonds of at least 90 mol % and is shown by the general formula:

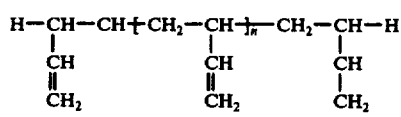
(1)

wherein $n$ is a positive integer, or polybutadiene or styrene-butadiene copolymer which contains in the molecule 1,4-bonds of at least 80 mol % and is shown by the general formula:

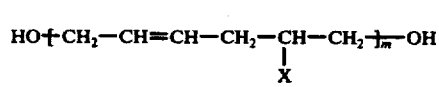
(2)

wherein X stands for $-CH=CH_2$ or $-C_6H_5$ and $m$ for a positive integer.

The liquid prepolymer is employed usually in an amount of 1 – 200 parts by weight, preferably 10 – 90 parts by weight per 100 parts by weight of the block copolymer as the component (a).

The photopolymerizable monomer utilizable as the component (c) in the composition of the present invention is a polymerizable monomer having at least one vinyl group $CH_2=C<$. Illustrative of such monomer are diesters derived from an aliphatic or alicyclic diol with 2 – 10, especially 2 – 6 carbon atoms such as ethylene glycol, triethylene glycol, tetraethylene glycol, hexanediol or cyclohexandiol and a monoethylenically unsaturated monocarboxylic acid with 3 – 5 carbon atoms such as acrylic acid or methacrylic acid; triesters derived from a triol and the above-mentioned unsaturated monocarboxylic acid; and polyvinyl esters of polycarboxylic acids. These esters may be used singly or as a mixture of at least two. This monomer is used usually in an amount of 3 – 30 parts by weight per 100 parts by weight of a total of the component (a) and the component (b).

The photopolymerization initiator utilizable as the component (d) in the composition of the present invention is any of the known photopolymerization initiators conventionally used for photosensitive resins of this type. Photopolymerization initiators of benzoin series, benzophenone series and anthraquinone series are particularly preferable. These photopolymerization initiators may be used singly or as a mixture of at least two. The photopolymerization initiator is used usually in an amount of 0.1 – 30 parts by weight per 100 parts by weight of the monomer component (c).

If desired, the composition of the present invention may be incorporated with a thermopolymerization inhibitor. Preferred thermopolymerization inhibitors are those of cresol series, phenol series and hydroquinone series. This inhibitor is used usually in an amount of 0.05 – 1 part by weight per 100 parts by weight of the component (c). The use of such thermopolymerization inhibitor is not necessarily required but is advantageous in the majority of cases. So far as the excellent physical properties are deteriorated, the composition of the present invention may be incorporated with additives which are conventionally added to rubber and plastics, such as hydrocarbons, naphthene oil, paraffin oil, waxes, natural oils and solvent-soluble natural or synthetic resins. A coloring agent such as pigment or dye may be added to the composition.

The composition of the present invention can be processed to a photosensitive resin layr suitable for the manufacture of a relief plate according to a known conventional method by dissolving the whole components in an organic solvent, shaping the solution as such into a film or plate and removing the solvent, or alternatively, by mixing the whole components in a roll mixer and shaping the mixture into a film or plate by means of a hot press. With the aid of an adhesive such as a synthetic rubber adhesive, the photosensitive resin layer thus obtained is attached under pressure onto a dimensionally stable support, for example, a polyester plate, steel plate or aluminum plate. The resultant photosensitive element is exposed imagewise through an original to the light having wave lengths of 250 – 500 mμ irradiated from a light source such as a chemical lamp, black light, carbon arc lamp, high voltage or ultrahigh voltage mercury lamp or xenon arc lamp. The exposed resin layer is then washed with a developer, for example, a chlorinated hydrocarbon or a mixture thereof with an alcohol to wash off unexposed areas of the resin whereby a relief plate having rubbery elasticity is obtained which is suitable for use in flexographic printing. Any of the developers can be used for this purpose so far as they do not dissolve the exposed resin composition but dissolve unexposed resin composition.

Figure 3:
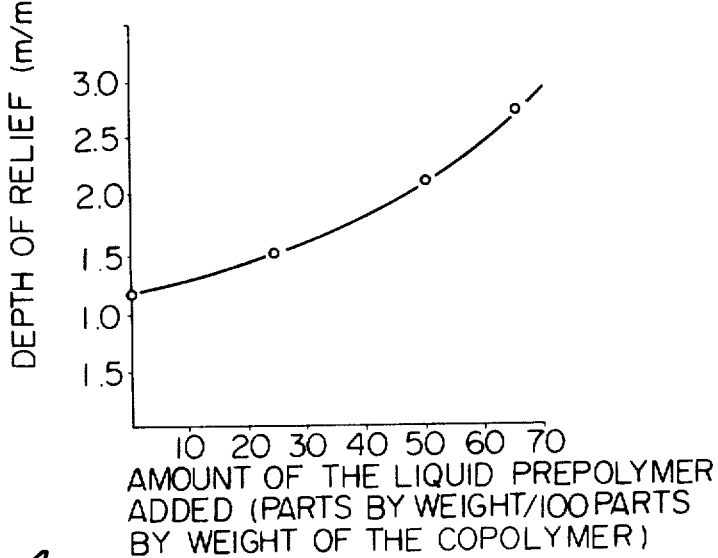
FIG. 3 is a graph showing the relation between the amount of the liquid prepolymer added and the depth of relief.

In the composition of the present invention, the block copolymer used as the component (a) contains a large amount (35 – 50% by weight) of styrene which exhibits a synergistic effect with the liquid prepolymer used as the component (b) so that the developing time in this case is much faster than that in the case of the prior art relief plate for use in flexographic printing. Moreover, the composition of the present invention brings about such a merit that it easily gives a suitable depth of relief for printing a material having uneven thickness or coarse surfaces such as carton. For example, FIG. 3 which is a graph showing the depth of relief in terms of mm obtained in a developing treatment of compositions wherein various amounts of the liquid prepolymer has been added to the styrene-butadiene block copolymer containing 42% by weight of styrene conducted at 25° C for 4 minutes with a mixture of 1,1,1-trichloroethane and isopropyl alcohol (mixing ratio : 3:1 by volume) as developer solution, obviously teaches that the depth of relief depends on not only the content of styrene in the component (a) but also the amount of the liquid prepolymer used as the component (b).

In the case of a known conventional photosensitive composition which are devoid of the above mentioned components (a) and (b), the maximum depth of relief obtained therefrom is about 0.8 mm. Although an attempt was made to increase the depth of relief in the known photosensitive composition, relief images with good quality could not be obtained. On the other hand, the use of the composition of the present invention warrants the formation of relief images having a depth of approximately 3.0 mm. Especially, the use of the block copolymer abounding in styrene improves not only solubility but also transparency of the resin so that the formation of relief images having a sufficient depth can be achieved by deep transmission of light having effective wave lengths and quicker washing treatment.

As deep relief images can easily be obtained from the composition of the present invention, printing of carton with a plate obtained from photosensitive resins which has not been considered to be operable becomes now possible by the use of the composition of the present invention. The known conventional rubber plates are manufactured chiefly for the purpose of easy handling for handengraving or press-molding so that the printing effect of the plates is sacrificed to a certain degree. In the composition of the present invention, however, printing effects such as rate of ink transfer and revolving power can extremely be enhanced. Furthermore, the composition of the present invention brings about such an additional merit that the composition is easily developabale so that fatigue of the developer solution in the manufacture of relief plates is minimized and the manufacture of relief plates can be attained with a small amount of the developer solution.

Figure 4:
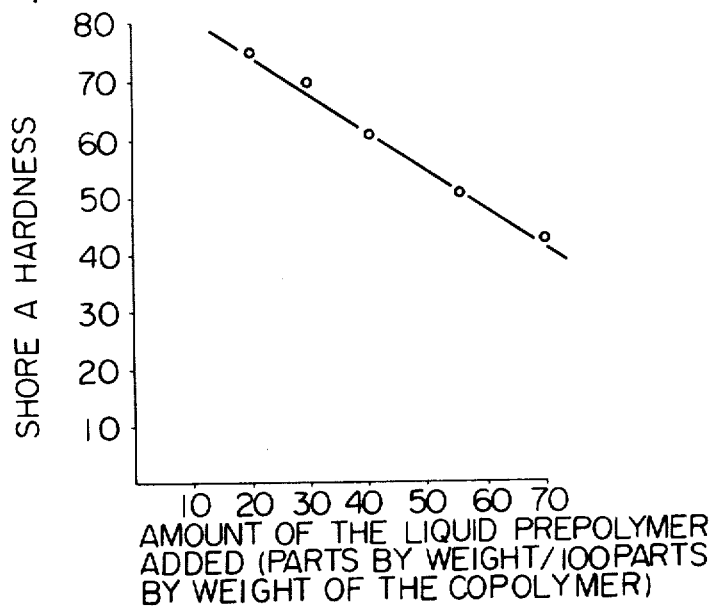
FIG. 4 is a graph showing the relation between the amount of the liquid prepolymer added and Shore A hardness.

The relief plate of excellent quality obtained from the composition of the present invention has the same degree of elasticity as shown by the known conventional rubber plates for use in flexographic printing and is improved in abrasion resistance because the relief plate is free of additives such as carbon black, white carbon and plasticizers. In general, the plates for use in flexographic printing have a Shore A hardness of 30°-90°, preferably 30°-80°. The composition of the present invention can control the rubber hardness of the resulting relief plate by adjusting the amount of the liquid prepolymer added as the component (b). For example, FIG. 4 which is a graph showing the relation between the amount of the liquid polymer added to the composition of the present invention and Shore A hardness of the resultant relief plate, obviously shows that the hardness can be controlled to a desired value by adjusting the amount of the liquid prepolymer added to the composition. Variation in the proportion of the liquid prepolymer also serves to impart improved stability, mechanical strength and solvent-resisting property to the relief plate.

To further illustrate the present invention, and not by way of limitation, the following examples and comparative examples are given. In each example, percentage is shown by weight unless otherwise indicated particularly.

EXAMPLE 1

To 120 parts by weight of methyl ethyl ketone were added 100 parts by weight of styrene-butadiene block copolymer containing 42 parts by weight of styrene (Trade name "Tufprene" produced by Asahi Kasei, Japan), 25 parts by weight of butadiene homopolymer having a molecular weight of 1,000 (Trade name "Nisso PB.B1,000" produced by Nihon Soda, Japan), 5 parts by weight of tetraethyleneglycol diacrylate, 14 arts by weight of trimethylolpropane triacrylate, 0.8 part by weight of benzoin isopropyl ether and 0.01 part by weight of methylhydroquinone. The mixture was stirred for about 2 hours under reflux to effect dissolution of the solid materials. The solution was spread over a support to form a sheet which was then dried in a drier for about 16 hours at 42°-45° C to remove the solvent whereby a film having a thickness of 2.5 mm was obtained. This film was used as a photosensitive resin original plate for flexographic printing. This photosensitive layer was exposed for 12 minutes through an original image to the light irradiated from a 20 W chemical lamp (Toshiba FL20BL), washed for 3 minutes by brushing with a developer solution composed of 3 parts by weight of tetrachloroethylene and 1 part by weight of n-butanol to wash out unexposed areas of the plate, and dried in a hot blast drier at 80° C whereby a relief pattern having a depth of 1.5 mm and being dimensionally faithful to the original image was obtained This relief had a Shore A hardness of 68° at room temperature. After one month, the relief also had a Shore A hardness of 68° , thus showing no change in hardness with the lapse of time. The relief plate was excellent in rubber elasticity and printing aptitude besides hardness and served as a printing plate of good quality.

The sensibility of the photosensitive resin layer was measured with a Kodak step tablet in the above mentioned exposure treatment whereby the scale of the step for insolubilization was determined as 12.

COMPARATIVE EXAMPLE 1

To 120 parts by weight of methyl ethyl ketone were added 100 parts by weight of styrene-butadiene block copolymer containing 42% by weight of styrene (Trade name Tufprene produced by Asahi Kasei, Japan), 4 parts by weight of tetraethyleneglycol diacrylate, 12 parts by weight of trimethylolpropane triacrylate, 0.7 part by weight of benzoin isopropyl ether and 0.008 part by weight of methylhydroquinone. The mixture was processed to a sheet in the same manner as described in Example 1 whereby a film having a thickness of 2.2 mm was obtained. This film was used as a photosensitive resin original plate for flexographic printing. The photosensitive layer of this plate was attached closely to an original negative film and exposed for 12 minutes to the light irradiated from a 20 W chemical lamp (Toshiba FL20BL). The exposed plate was washed for 3 minutes by brushing with the same developer solution as described in Example 1 and dried in a drier in a similar manner to that described in Example 1 whereby a relief pattern having a depth of 1.2 mm and being dimensonally faithful to the original image was obtained. This relief had a Shore A hardness of 75° at room temperature. After one month the hardness was changed to 82°. The sensibility of the photosensitive resin layer was measured in a similar manner to that described in Example 1 whereby the scale of the step was determined as 11.

COMPARATIVE EXAMPLE 2

To a mixture of 100 parts by weight of toluene and 80 parts by weight of methyl ethyl ketone were added 100 parts by weight of styrene-butadiene copolymer containing 28% by weight of styrene (Trade name "Cariflex TR-1101" produced by Shell Petrochem, Japan), 35 parts by weight of polybutadiene having a molecular weight of 1,000, 7 parts by weight of trimethylolpropane triacrylate, 4 parts by weight of tetraethyleneglycol diacryate, 1 part by weight of benzoin isopropyl ether and 0.005 part by weight of methylhydroquinone. The mixture was processed to a sheet in the same manner as described in Example 1 and dried for 20 hours in a hot blast drier at 45°–50°C whereby a film having a thickness of 1.5 mm was obtained. This film was used as a photosensitive resin original plate for flexographic printing. The photosensitive plate was exposed imagewise for 12 minutes according to the same operation as described in Example 1, washed similarly for 3 minutes by brushing and dried in a drier whereby a relief pattern having a depth of 0.7 mm was obtained. After further developing the relief pattern for 3 minutes, a relief pattern having a depth of 1.1 mm was obtained. The Shore A hardness of this relief was 65° at room temperature and 68° after one month. The sensibility of the photosensitive resin layer was determined as 11 in a similar testing method.

COMPARATIVE EXAMPLE 3

To a mixture of 100 parts by weight of toluene and 80 parts by weight of methyl ethyl ketone were added 6 parts by weight of trimethylolpropane triacrylate, 4 parts by weight of tetraethyleneglycol diacrylate, 1 part by weight of benzoin isopropyl ether and 0.005 part by weight of methylhydroquinone. The mixture was spread in the form of a sheet in the same manner as described in Example 1 and dried for 20 hours in a hot blast drier at 45°–50° C whereby a film having a thickness of 1.4 mm was obtained. This film was used as a photosensitive resin original plate for flexographic printing. The film was exposed imagewise for 12 minutes according to the same operation as described in Example 1, washed similarly for 3 minutes by brushing and then dried in a hot blast drier at 80° C whereby a relief pattern having a depth of 1.2 mm was obtained. As a considerable time was required for the washing, however, swelling of the relief was so significant that it could not be used as a relief for use in flexographic printing. The Shore A hardness of this relief was 72° under proper conditions and 80° after one month. The sensibility of the photosensitive resin layer was determined as 10 in a similar testing method.

EXAMPLE 2

To 100 parts by weight of methyl ethyl ketone were added 95 parts by weight of styrene-butadiene block copolymer containing 42% by weight of styrene (Trade name Tufprene produced by Asahi Kasei, Japan), 17 parts by weight of polybutadiene having a molecular weight of 1,000 (Trade name Nisso PB.B-1000 produced by Nihon Soda, Japan), 17 parts by weight of polybutadiene having a molecular weight of 2,000 (Trade name "Nisso PB.B-2000" produced by Nihon Soda, Japan), 25 parts by weight of styrene-butadiene copolymer having a molecular weight of 4,000–5,000 (Trade name "Poly bd,CS-15" produced by Idemitsu Petrochem., Japan), 8 parts by weight of tetraethyleneglycol diacrylate, 15 parts by weight of trimethylolpropane triacrylate, 0.7 part by weight of benzoin methyl ether and 0.015 part by weight of methylhydroquinone. The mixture was stirred under reflux and processed according to the same operation as described in Example 1 whereby a film having a thickness of 3.0 mm was obtained. This film was used as an original plate for flexographic printing. The photosensitive layer was exposed for 5 minutes through an original image to the light irradiated from a 2 KW ultrahigh voltage mercury lamp, washed for 4 minutes by brushing with a developer solution composed of 4 parts by weight of 1,1,1-trichloroethane and 1 part by weight of isopropyl alcohol to wash out unexposed areas of the layer and dried in a hot blast drier at 60° C whereby a relief plate having a depth of 2.5 mm and being dimensionally faithful to the original image and suitable for use in flexographic printing was obtained. This relief plate had a Shore A hardness of 52° at room temperature. After one month, the relief plate also had a Shore A hardness of 52°, thus showing no change in hardness with the lapse of time. This relief plate gave very good results in printing on carton

COMPARATIVE EXAMPLE 4

To 220 parts by weight of toluene were added 90 parts by weight of styrene-butadiene block copolymer containing 31% by weight of styrene (Trade name "Solprene T-411" produced by Nihon Elastomer, Japan), 9 parts by weight of trimethylolpropane triacrylate, 2 parts by weight of tetraethyleneglycol diacrylate, 0.8 part by weight of benzophenone and 0.005 part by weight of methylhydroquinone. The mixture was worked up according to the same operation as described in Example 1 to form a film having a thickness of 1.2 mm which was used as a photosensitive resin layer. This photosensitive resin layer was attached closely to an original negative film, exposed therethrough of 5 minutes to the light irradiated from a 2 KW ultrahigh voltage mercury lamp, washed for 4 minutes with a developer solution similar to that used in Example 2 and then dried whereby a relief having a depth of 0.6 mm was obtained. The Shore A hardness of this relief was 67° at room temperature and 80° after one month.

EXAMPLE 3

To 120 parts by weight of methyl ethyl ketone were added 100 parts by weight of styrene-butadiene block copolymer containing 42% by weight of stryene (Trade name Tufprene produced by Ashai Kasei, Japan), 18 parts by weight of trimethylolpropane triacrylate, 10 parts by weight of polybutadiene having a molecular weight of 1,000 (Trade name Nisso PB.C-1000 produced by Nihon Soda, Japan), 20 parts by weight of polybutadiene having a molecular weight of 2,000 (Trade name Nisso PB.B-2000 produced by Nihon Soda, Japan), 25 parts by weight of styrene-butadiene copolymer having a molecular weight of 4,000–5,000 (Trade name "Poly bd, CS-15" produced by Idemitsu Petrochem., Japan), 10 parts by weight of polybutadiene having a molecular weight of 4,000–5,000 (Trade name "Poly bd, RT45HT" produced by Idemitsu Petrochem., Japan), 0.6 parts by weight of benzoin isopropyl ether, 0.05 part by weight of 2-ethylanthraquinone and 0.01 part by weight of methylhydroquinone. The mixture was processed to a film according to an operation similar to that described in Example 1 whereby a photosensitive resin layer for flexographic printing was obtained which had a thickness of 3.0 mm. This photosensitive layer was attached closely to an original negative film, exposed therethrough for 20 minutes to the light irradiated from a 20 W chemical lamp (Toshiba FL20BL), washed for 4 minutes by brushing with a mixture of 3 parts by weight of 1,1,1trichloroethane and 1 part by weight of isopropyl alcohol, and then dried in a hot blast drier at 60° C whereby a relief pattern having a depth of 2.7 mm and being dimensionally faithful to the original negative film was obtained. This relief had a Shore A hardness of 45° at room temperature. After one month, the relief had also a Shore a hardness of 45°, thus showing no change in hardness with the lapse of time. A result suitable for flexographic printing was thus obtained.

What is claimed is:

1. A photosensitive resin composition for flexographic printing plates comprising (a) styrene-butadiene block copolymer containing 35–50% by weight of styrene, (b) at least one liquid prepolymer having a molecular weight of 1,000–5,000 selected from the group consisting of polybutadiene and butadiene-styrene copolymer, and (c) at least one photopolymerizable monomer containing one or more vinyl groups.

2. The photosensitive resin composition of claim 1 wherein said liquid prepolymer as the component (b) is contained in amount of 1-200 parts by weight per 100 parts by weight of said styrene-butadiene block copolymer as the component (a).

3. The photosensitive resin composition of claim 1 wherein said photopolymerizable monomer as the component (c) is contained in an amount of 3-30 parts by weight per 100 parts by weight of a total of said styrene-butadiene block copolymer as the component (a) and said liquid prepolymer as the component (b).

4. The photosensitive resin composition of claim 1 wherein said photopolymerizable monomer as the component (c) is a polyvinyl ester obtained by reacting a diol or triol having 2-10 carbon atoms with a monoethylenically unsaturated monocarboxylic or polycarboxylic acid having 3-5 carbon atoms.

5. The photosensitive resin composition of claim 1 wherein a thermopoloymerization inhibitor is contained in an amountof 0.05-1 part by weight per 100 parts by weight of said photopolymerizable monomer as the component (c).

6. The photosensitive resin composition of claim 1 wherein said composition is shaped into a film or plate.

7. The photosensitive resin composition of claim 1 which contains a photopolymerization initiator.

8. The photosensitive resin composition of claim 7 wherein said photopolymerization initiator as the component (d) is contained in an amount of 0.1-30 parts by weight per 100 parts by weight of said photopolymerizable monomer as the component (c).

9. The photosensitive resin composition of claim 1 in which said styrene-butadiene block copolymer is a soluble, thermoplastic composed of at least two thermoplastic non-elastomeric polystyrene blocks and an elastomeric polybutadiene block interposed between the polystyrene blocks.

10. The photosensitive resin composition of claim 9 in which said liquid prepolymer (b) is a polybutadiene which contains in the molecule 1,2 - bonds of at least 90 mol% having the formula

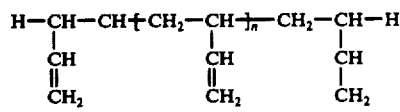

wherein $n$ is a positive integer,
or polybutadieneor styrene butadiene copolymer which contains in the molecule 1,4-bonds of at least 80 mol % and is shown by the general formula:

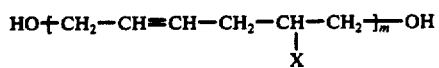

wherein X stands for $-CH=CH_2$ or $-C_6H_5$ and m for a positive integer.

* * * * *